(12) United States Patent
Mahendra et al.

(10) Patent No.: US 10,044,345 B2
(45) Date of Patent: Aug. 7, 2018

(54) CIRCUIT FOR IMPROVING CLOCK RATES IN HIGH SPEED ELECTRONIC CIRCUITS USING FEEDBACK BASED FLIP-FLOPS

(71) Applicant: Indian Institute of Technology, Bombay, Powai, Mumbai, Maharashtra (IN)

(72) Inventors: Sakare Mahendra, Maharashtra (IN); Gupta Shalabh, Maharashtra (IN); Kumar Sadhu Pavan, Maharashtra (IN)

(73) Assignee: INDIAN INSTITUTE OF TECHNOLOGY, BOMBAY, Powai, Mumbai, Maharashtra (IN)

( * ) Notice: Subject to any disclaimer, the term of this patent is extended or adjusted under 35 U.S.C. 154(b) by 5 days.

(21) Appl. No.: 14/589,473

(22) Filed: Jan. 5, 2015

(65) Prior Publication Data

US 2015/0194950 A1    Jul. 9, 2015

(30) Foreign Application Priority Data

Jan. 6, 2014    (IN) .............................. 44/MUM/2014

(51) Int. Cl.
*H03K 3/289*    (2006.01)
*H03K 3/356*    (2006.01)

(52) U.S. Cl.
CPC .............................. *H03K 3/356078* (2013.01)

(58) Field of Classification Search
None
See application file for complete search history.

(56) References Cited

U.S. PATENT DOCUMENTS

| | | | | |
|---|---|---|---|---|
| 2004/0075479 A1* | 4/2004 | Gupta | .................. | H03K 3/0372 327/202 |
| 2005/0231258 A1* | 10/2005 | Suzuki | .................. | H03K 3/289 327/218 |
| 2011/0298516 A1* | 12/2011 | Pal | ...................... | H03K 3/35625 327/202 |
| 2012/0229187 A1* | 9/2012 | Choudhury | ......... | G11C 11/4125 327/202 |

* cited by examiner

*Primary Examiner* — Long Nguyen
(74) *Attorney, Agent, or Firm* — Tim Tingkang Xia, Esq.; Locke Lord LLP

(57) ABSTRACT

A flip-flop circuit for enhancing clock rates in high speed electronic circuits, the flip-flop circuit having an input terminal, an output terminal, and a third terminal that controls the flow of signal from the input terminal to the output terminal, comprising: two latches arranged in a master-slave configuration such that the input terminal of the first latch is also the input terminal of the flip-flop and the output terminal of the second latch is also the output terminal of the flip-flop; and at least one feedback path that adds signal to the input of the flip-flop from one of the outputs of the two latches.

7 Claims, 21 Drawing Sheets

CIRCUIT FOR IMPROVING CLOCK RATES IN HIGH SPEED ELECTRONIC CIRCUITS USING FEEDBACK BASED FLIP-FLOPS

CROSS-REFERENCE TO RELATED APPLICATIONS

This non-provisional application claims priority under 35 U.S.C. § 119(a) on Patent Application No(s). 44/MUM/2014 filed in India on Jan. 6, 2014, the entire contents of which are hereby incorporated by reference.

FIELD OF THE INVENTION

The present invention relates to a circuit for enhancing clock rates in high speed electronic circuits.

BACKGROUND OF THE INVENTION

Modern electronic products, including, for example, consumer electronics, computers, telecommunication equipment and automobile electronics use flip-flop circuits to store data during data processing operations. Flip-flop circuits are bistable circuits having output signals assuming one of two stable states based on a signal level or signal transition of an input signal.

D-Flip-Flop, also known as data-Flip-Flop is a fundamental circuit block in digital logic circuits and is quite frequently used block in transmitters and receivers. However, transmitters and receivers are still electrical in nature and do not work at very high speed, for example emerging optical links target more than 100 Gb/s capacities. This speed limitation is primarily from the circuits of the receiver and transmitter involved in communication links. Accordingly, the channel bandwidth is underutilized. However, if transmitters and receivers can work at high speed then the available channel may be utilized efficiently. To achieve a high speed of more than 100 Gb/s, Bi-CMOS technologies can be used; however due to their high cost they are usually not taken into account. CMOS technologies are good replacement of Bi-CMOS technologies but are slow in nature.

D-Flip-Flops with master-slave configuration are generally used in high speed applications. The present master-slave flip-flop comprises a master latch and a slave latch having respective data inputs, data outputs, and clock inputs, with the data output of the master latch connected to the data input of the slave latch. The data input of the master latch is the flip-flop's data input, and the data output of the slave latch is the flip-flop's data output.

In high speed application the devices are generally made wide to carry large amount of current which increases the input capacitance. D-Flip-Flops are also driven by source which has finite output impedance. These factors such as parasitic resistances and capacitances lead to input data having inter-symbol interference in D-Flip-Flops. It causes erroneous output and jitter.

Furthermore, inverter delays and switching delays in relation to the clock signal transitions, referred to as setup and hold delays, limit the speed at which a latch is able to setup and hold data represented in the input signal. Conventional latches have setup and hold delays of typically several picoseconds. In other words, there is an interval of several picoseconds before a clock signal transitions from a sample period to a hold period, wherein no change in the output signal would likely occur despite a change in the input signal. As a result, conventional latches are undesirably limited to processing signals having higher data rates.

In communication links such as serializers/deserializers, clock to data recovery (CDR) circuits, frequency dividers, delay elements etc., inductive peaking, active feedback technique, capacitive degeneration, T-coil techniques etc. are generally used to increase speed of high speed modules. However such modifications are neither cost effective nor do they provide a required result in an efficient manner.

Nevertheless, a need exists in the electronic industry to process data at even greater data rates.

SUMMARY OF THE INVENTION

Accordingly, the present invention in one aspect provides a flip-flop circuit for enhancing clock rates in high speed electronic circuits, the flip-flop circuit having an input terminal, an output terminal, and a third terminal that controls the flow of signal from the input terminal to the output terminal, comprising: two latches arranged in a master-slave configuration such that the input terminal of the first latch is also the input terminal of the flip-flop and the output terminal of the second latch is also the output terminal of the flip-flop; and at least one always active (ON) feedback path that adds signal to the input of the flip-flop from one of the outputs of the two latches. No external control is required for enabling and disabling the feedback.

In another embodiment, the present invention provides a latch having an input terminal, an output terminal, and a third terminal that controls the flow of signal from the input terminal to the output terminal, comprising: an amplifier stage whose input terminal is the input terminal of the latch and the output terminal is the output terminal of the latch; a positive feedback stage connected to the output terminal of the latch; and an always active (ON) feedback path that adds signal to the input of the latch from the output of the latch. No external control is required for enabling and disabling the feedback.

BRIEF DESCRIPTION OF THE DRAWINGS

Reference will be made to embodiments of the invention, examples of which may be illustrated in accompanying figures. These figures are intended to be illustrative, not limiting. Although the invention is generally described in context of these embodiments, it should be understood that it is not intended to limit the scope of the invention to these particular embodiments.

FIG. 5b shows equivalent circuit of the block diagram described in FIG. 4a;

FIG. 6 is an equivalent circuit at the input of latch described in FIG. 4a;

DETAILED DESCRIPTION OF THE INVENTION

The present invention relates to circuit for enhancing clock rates in a high speed electronic circuits thereby improving the performance of high speed communication links.

Finite output impedance of the source and large input capacitance in a conventional D-Flip Flop forms a low pass filter. To nullify the effect of this low pass filter, a high pass filter is needed. According to the present invention, this high pass filter is implemented by an always active (ON) negative feedback across D-Flip-Flop, where no external control is required for enabling and disabling the feedback. Each D-Flip-Flop of communication systems are thus used to equalize previous erroneous data which forms distributed equalizer so additional power hungry equalizers requirement is relaxed.

Figure 1:
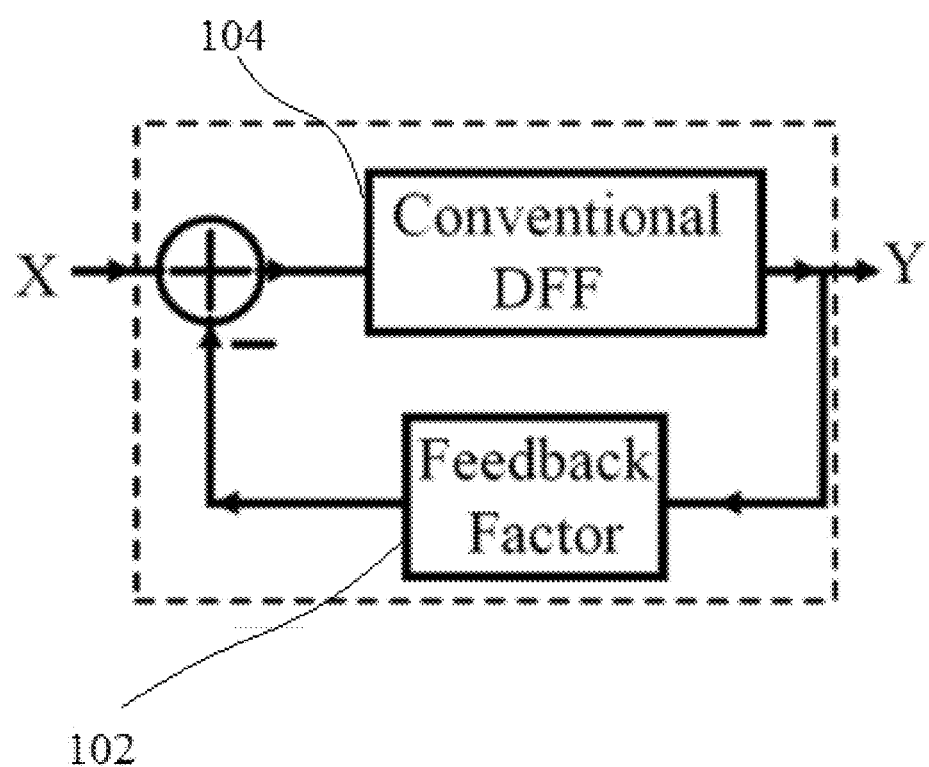
FIG. 1 is a block diagram of circuit according to present invention.

FIG. 1 is a block diagram of circuit according to present invention. As shown in the circuit, an always active (ON) negative feedback loop 102 is connected across a conventional D-Flip-Flop 104 according to present invention to adjust or correct or enhance the clock input of the D-Flip-Flop, where no external control is required for enabling and disabling the feedback. Negative feedback across D-Flip-Flop also mitigates timing errors which is caused by RC delay at the input of D-Flip-Flop.

Figure 2:
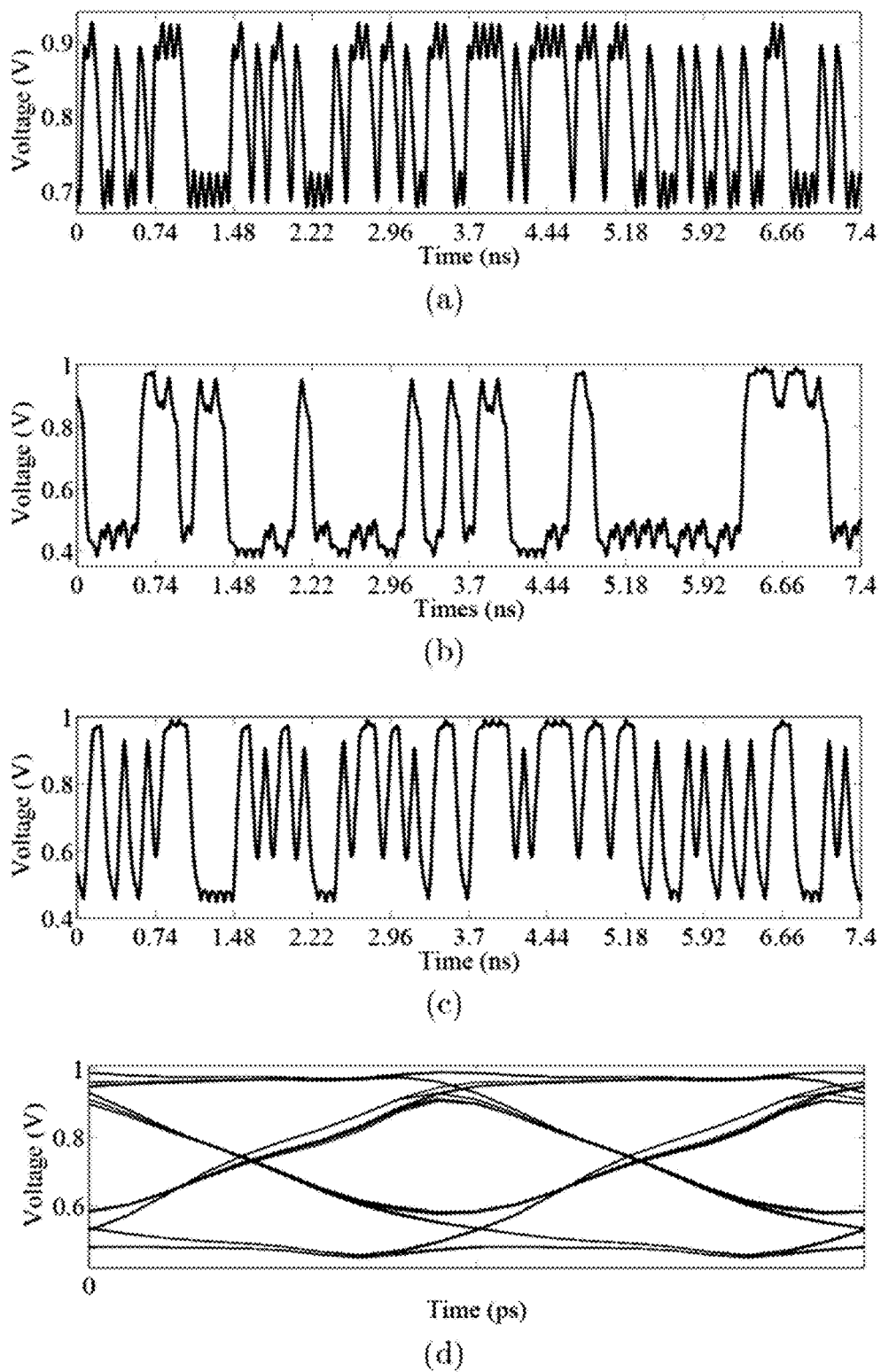
FIG. 2 is a simulation result with input data at 11.9 Gb/s data rate.

FIG. 2 is a simulation result using the circuitry described in FIG. 1 with input data at 11.9 Gb/s data rate. FIG. 2a shows an input data at 11.9 Gb/s data rate. FIG. 2b shows the result of a conventional D-Flip-Flop wherein data rate of 11.9 Gb/s is not resolved. FIGS. 2c and 2d shows that D-Flip-Flop according to present invention is working fine with 200 mV input data in same simulation conditions. FIG. 2d relates to eye diagram of D-Flip-Flop according to present invention showing 326 mV eye opening with 7 ps jitter$_{pp}$. It may be noted that any adaptive algorithm for finding feedback coefficient of feedback e.g. least square algorithm, least mean square algorithm may be implemented. The feedback can be adaptive, based on load conditions i.e. the feedback coefficient is adjusted based on adaptive algorithms.

Figure 3:
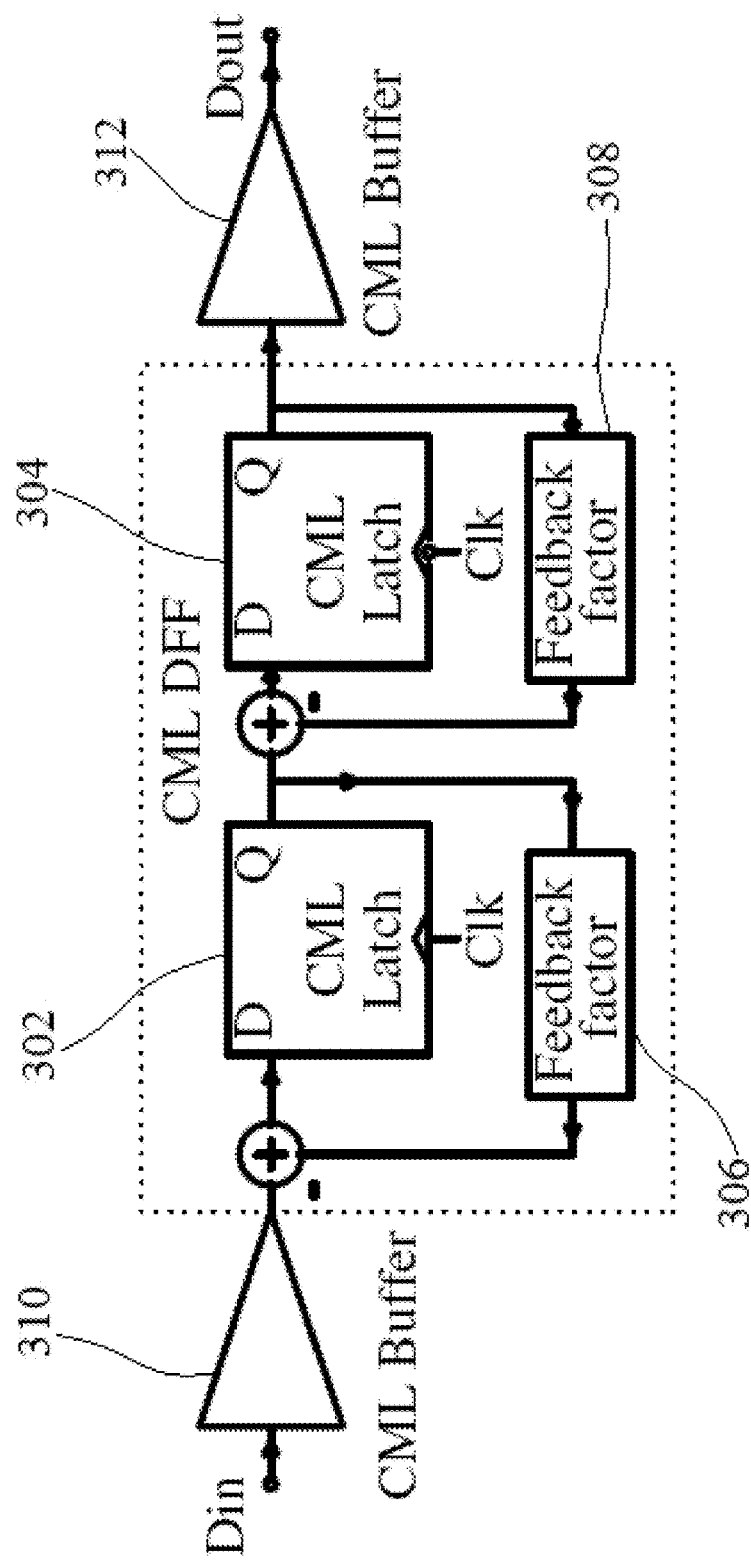
FIG. 3 is a block diagram of D-Flip-Flop based on feedback based latches.

In another embodiment of the present invention, circuit according to present invention is a master slave configuration. FIG. 3 shows a master-slave configuration of D-Flip-Flop according to present invention. There are two CML latches 302; 304 having respective always active (ON) local feedback 306; 308. Each latch 302; 304 in a master-slave configuration have two modes of operation, transparent mode and latch mode. In, D-Flip-Flop when clock is high, master latch is in transparent mode and slave latch is in latch mode and vice-versa. As mentioned, always active (ON) local negative feedback 306; 308 is employed in each of the D-Flip-Flop, where no external control is required for enabling and disabling the feedback. In transparent mode, it will cause 2-stage amplification using amplifying stage. Here, it is shown as a buffer 310; 312 but it can be any gm cell. For two stage amplifiers, the overall dc gain and the bandwidth are obtained by $G_T=G^2$ and $\omega_{bw}=\omega\sqrt{\text{square root over } (2^{1/2}-1)}$.

Figure 10:
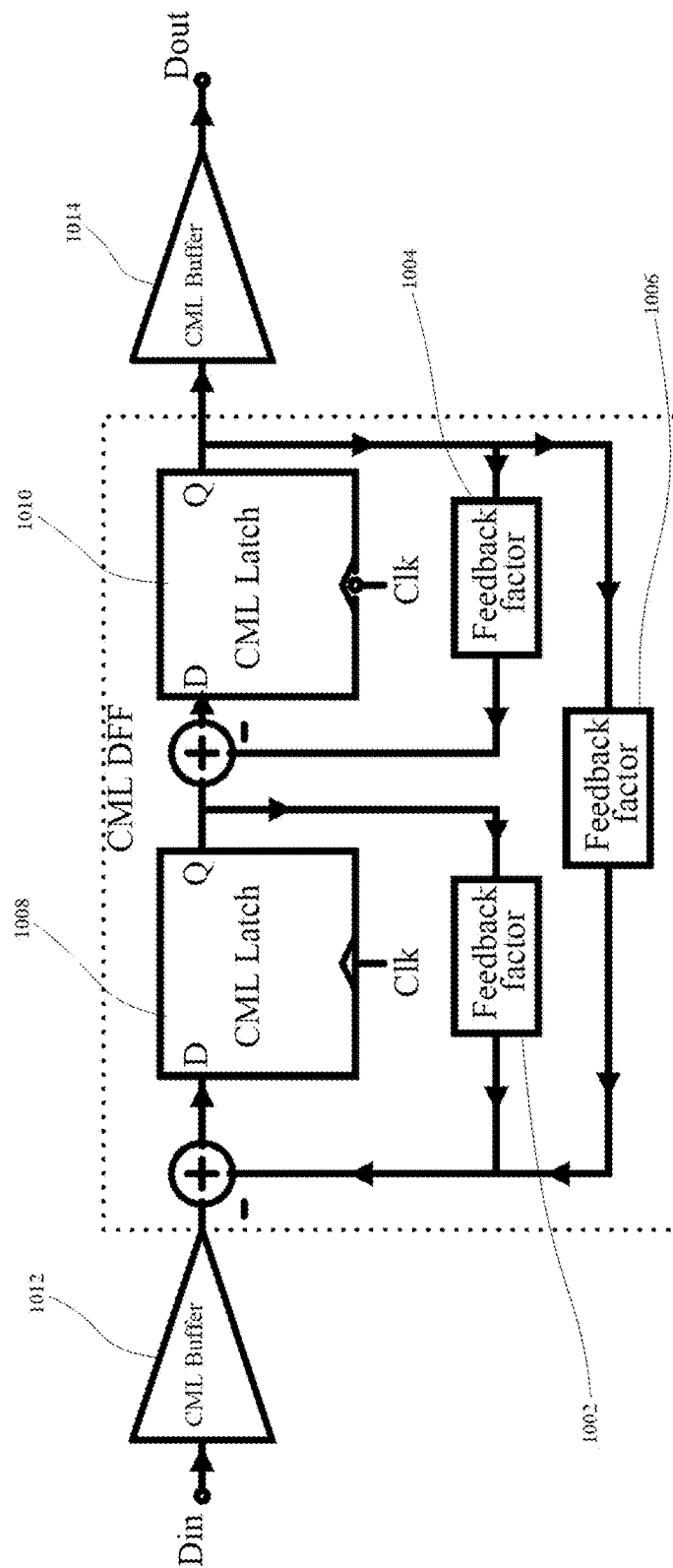
FIG. 10 is a block diagram of feedback based D-Flip-Flop using feedback based latches.

FIGS. 1, 3 and 10 particularly describes a flip-flop having an input terminal, an output terminal, and a third terminal that controls the flow of signal from the input terminal to the output terminal. The flip-flop comprises two latches arranged in a master-slave configuration such that the input terminal of the first latch is also the input terminal of the flip-flop and the output terminal of the second latch is also the output terminal of the flip-flop; and at least one always active (ON) feedback path that adds signal to the input of the flip-flop from one of the outputs of the two latches. The feedback path may be a path from the output of the flip-flop and added to the input of the flip-flop or a path from the output of the first latch and is added to the input of the flip-flop. The flip-flop described herein may also comprise a first feedback path from the output of the first latch and is added to the input of the flip-flop; and a second feedback path from the output of the flip-flop and is added to the input of the second latch. The feedback path may further comprise a transconductance stage or an inverter stage. The feedback may be a negative feedback and further the strength of feedback can be adapted using a control mechanism.

Figure 4:
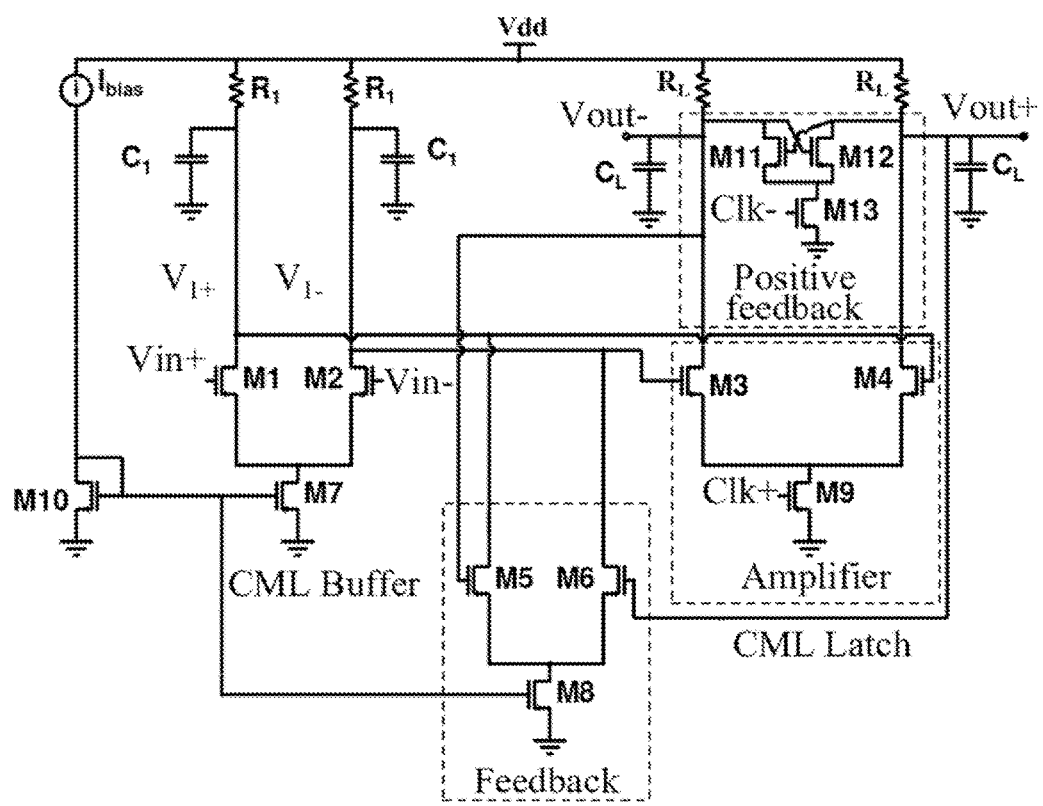
FIG. 4 is a schematic view of feedback based latches of a D Flip-Flop according to present invention.

FIG. 4 is a schematic view of feedback based latches of a D Flip-Flop according to present invention. FIG. 4 shows an always active (ON) feedback circuit comprising transistors M5, M6 and M8, where no external control is required for enabling and disabling the feedback. Output voltages $V_{out+}$ and $V_{out-}$ are fed to the feedback circuit through transistors M6 and M5 respectively, wherein clock signal Clk– and Clk+ are connected to transistors M13 and M9, respectively. In this regard when clock signal CLK+ is high the amplifier works and when clock signal CLK– is low then the feedback circuit works.

Figure 5A:
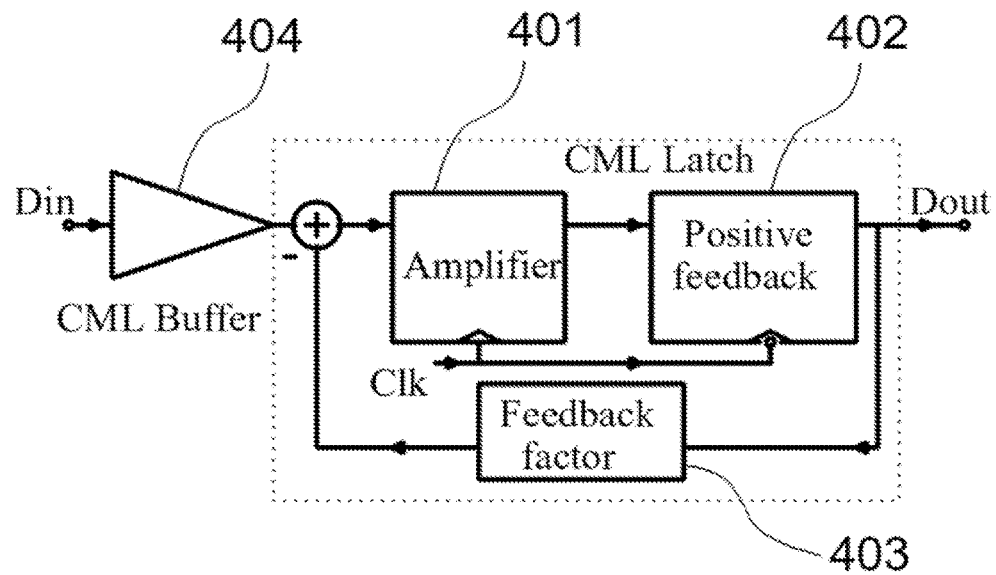
FIG. 5a is a block diagram of latch according to present invention.

FIG. 5a is a block diagram of latch according to present invention comprising an amplifier 401, a positive feedback 402, buffer 404, and a feedback 403. Feedback 403 is an always active (ON) negative feedback where no external control is required for enabling and disabling the feedback, according to present invention as described hereinbefore. FIG. 5a describes a latch having an input terminal, an output terminal, and a third terminal that controls the flow of signal from the input terminal to the output terminal, comprising:

an amplifier stage whose input terminal is the input terminal of the latch and the output terminal is the output terminal of the latch; a positive feedback stage connected to the output terminal of the latch; and a feedback path that adds signal to the input of the latch from the output of the latch. The feedback path from the output terminal to the input terminal may be a transconductance stage or an inverter stage. The feedback may be a negative feedback and further the strength of feedback can be adapted using a control mechanism.

Figure 5B:
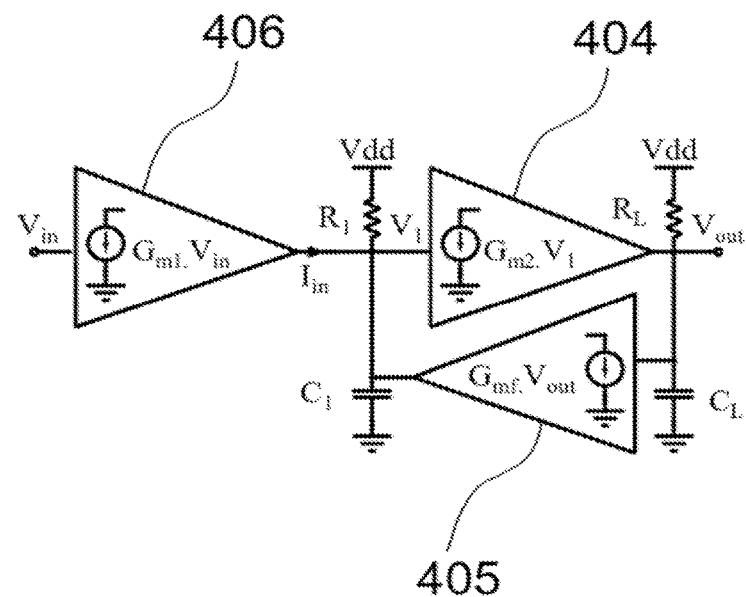
Figure 6:
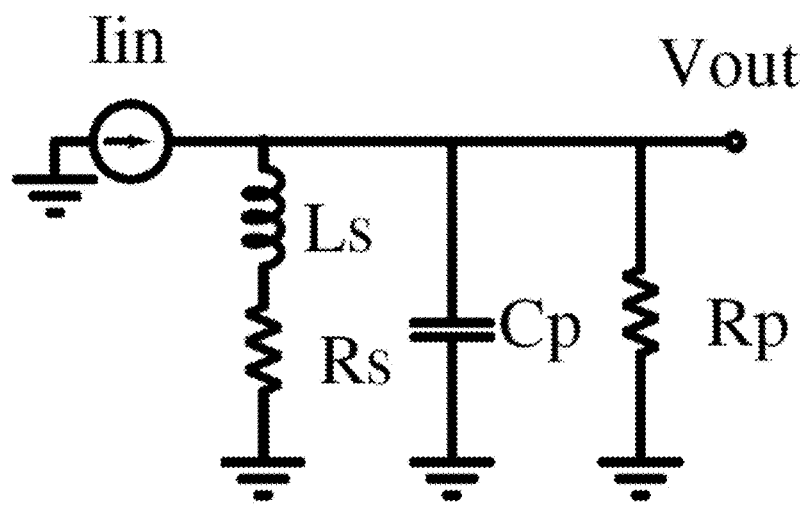

FIG. 5b shows equivalent circuit of the block diagram described in FIG. 5a wherein the circuit comprises a latch amplifier 404, an always active (ON) latch feedback 405 and buffer 406. FIG. 6 is an equivalent circuit at the input of latch described in FIG. 4a wherein $I_{in}$ denotes input current, inductance $L_s$ connected with resistance $R_s$ whereas $C_p$ and $R_p$ are parallel capacitance and resistance of the circuit.

Referring to FIGS. 4a and 4b, it gives:

$$-i_{in} - g_{mf}V_{out} + V_1/R_1 + V_1C_1s = 0 \quad (1)$$

$$g_{m2} - V_1 + V_{out}/R_L + V_{out}C_Ls = 0 \quad (2)$$

$$\frac{i_{in}}{V_1} = \frac{1}{\frac{(R_L + C_Ls)}{g_{m2} \times g_{mf}}} + \frac{1}{R_1} + sC_1 \quad (3)$$

Equation 3 shows an inductive peaking where, $R_p=R_1$, $C_p=C_1$, $$R_s = \frac{R_L}{g_{m2} \times g_{mf}} \text{ and } C_s = \frac{C_L}{g_{m2} \times g_{mf}}.$$

Transparent mode shows improvement because it generates inductive peaking at the input of latch. It causes parallel resonance.

$$\frac{V_{out}}{V_1} = -\frac{g_{m2}}{\left(\frac{1}{R_L} + sC_L\right)} \quad (4)$$

Equation 4 shows gain stage but at the same time, $V_{out}/V_{in}$ is determined by FIGS. 5a and 5b. Such an arrangement employs a transconductance stage $G_{mf}$ to return a fraction of the output to the input of $G_{m2}$. The transfer function of the overall amplifier is given by:

$$\frac{V_{out}}{V_{in}} = \frac{A_{vo}\omega n^2}{s^1 + 2\zeta\omega S + \omega_n^2} \text{ Where,} \quad (5)$$

$$A_{vo} = \frac{G_{m1}G_{m2}R_1R_L}{1 + G_{m1}G_{m2}R_1R_L} \quad (6)$$

$$\zeta = \frac{1}{2}\frac{R_1C_1 + R_LC_L}{\sqrt{R_1R_LC_1C_L(1 + G_{m1}G_{m2}R_1R_L)}} \quad (7)$$

$$\omega n^2 = \frac{1 + G_{mf}G_{m2}R_1R_L}{R_1R_LC_1C_L} \quad (8)$$

Figure 7:
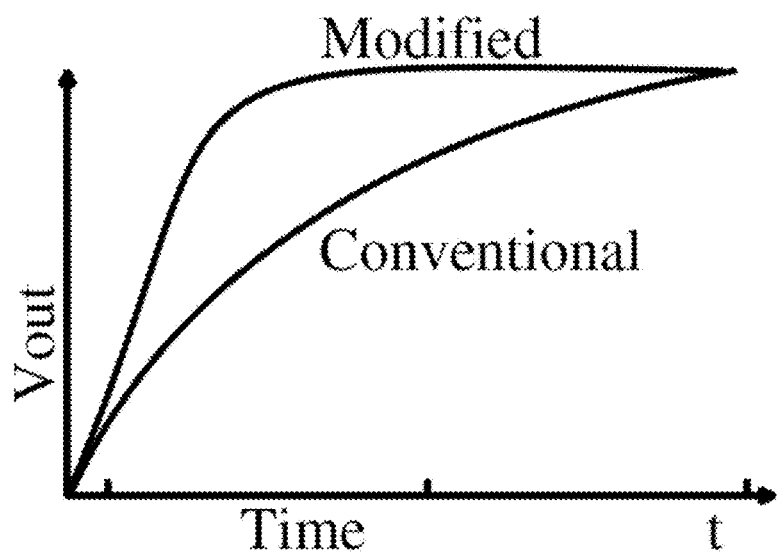
FIG. 7 is a time domain waveform for transparent mode of conventional latch and feedback based latch for $\zeta=0.7$.
Figure 8:
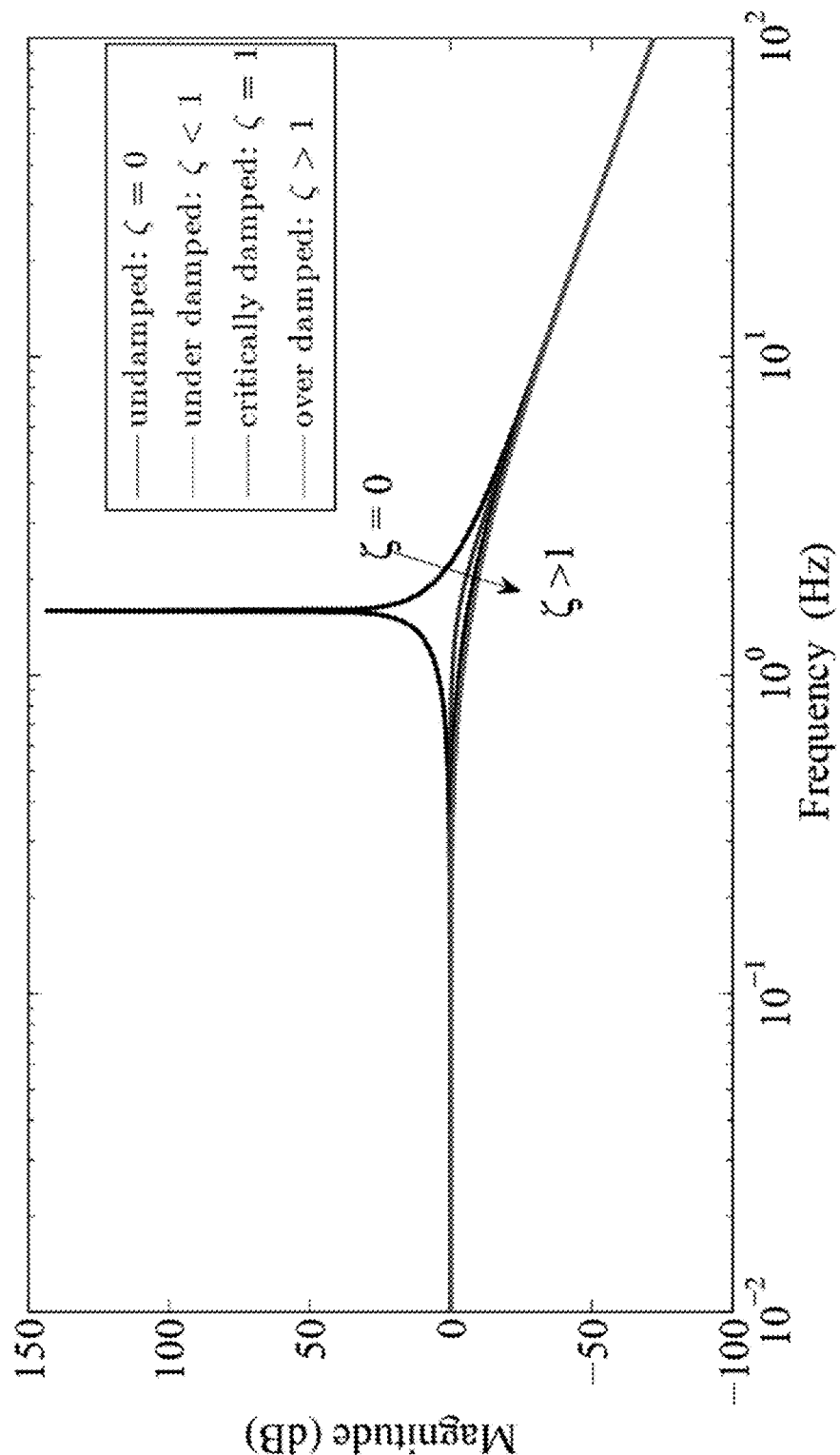
FIG. 8 is a frequency domain waveform for various $\zeta$ for second order equations.

Denominator of RHS of equation is second order equation 5. It provides complex conjugate poles which cause frequency resonance and peaking depending on $\zeta$ as shown in FIG. 6. FIG. 7 is a time domain waveform for transparent mode of conventional latch and feedback based latch for $\zeta=0.7$ whereas FIG. 8 is a frequency domain waveform for various $\zeta$ for second order equations. For an maximally-flat butter-worth response, $\zeta=\sqrt{2}/2$. The result reveals that always active (ON) local negative feedback increases the GBW in transparent phase of latch. In the place of buffer, any $g_m$ cell providing current to its capacitive load can be used. Time delay for latches are given by:

$$T_d = \tau\ln\frac{V_{logic}}{\Delta V} \text{ Where, } \tau = \frac{G_m}{C} \quad (9)$$

$G_m$=Trans-conductance of latch transistors.
C=output capacitances.
$V_{logic}$=Voltage level to be achieved.
$\Delta V$=Minimum input that can be resolved correctly.

Figure 20:
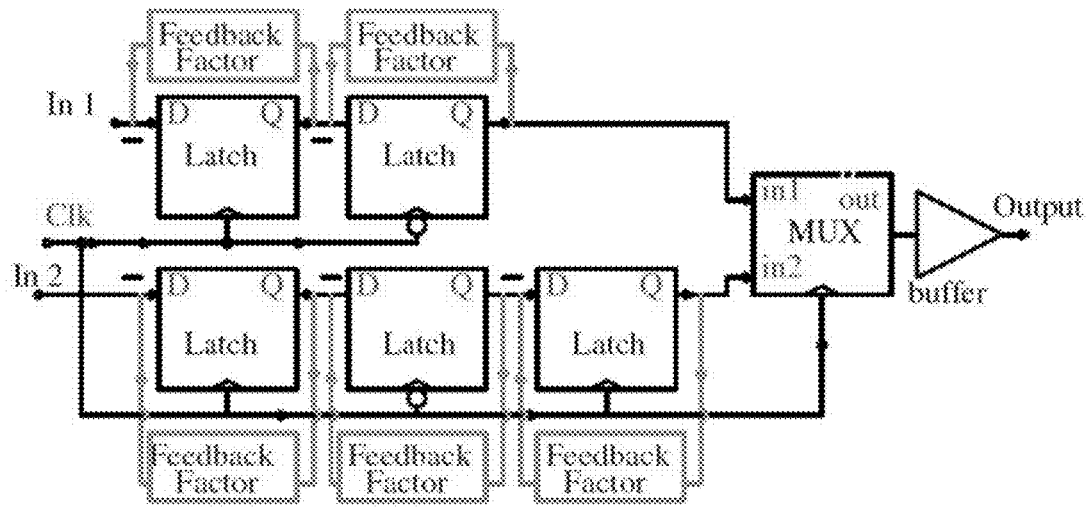
FIG. 20 is a block diagram of Serializer.
Figure 21:
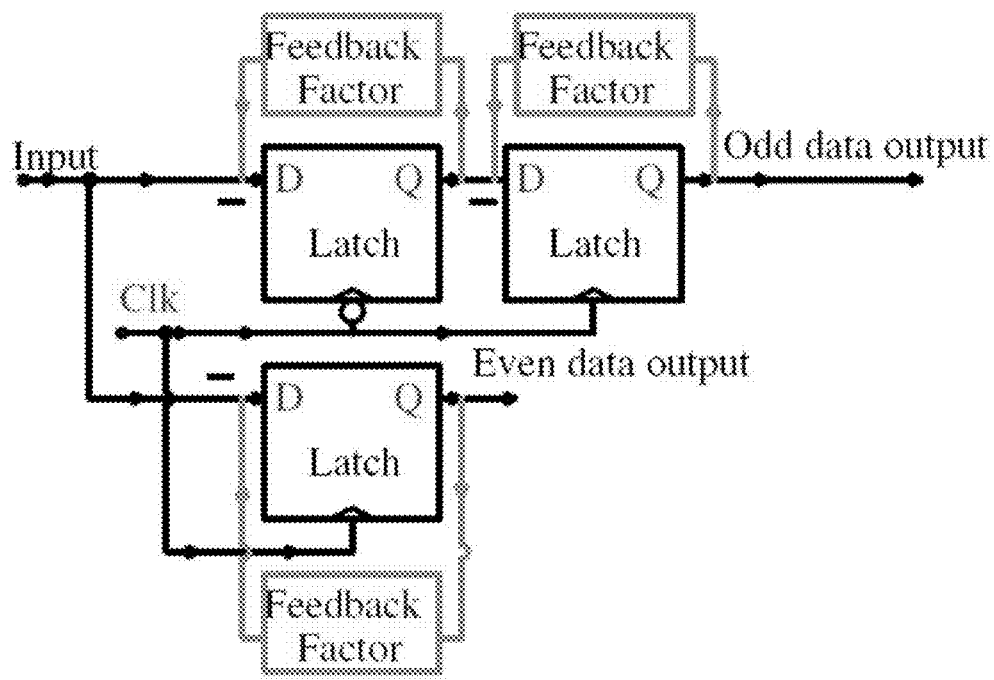
FIG. 21 is a block diagram of Deserializer.

By using proposed D-Flip-Flop, $\Delta V$ will be higher as compare to conventional D-Flip-Flop which leads to less time for latching for same clock frequency. Its application in serializers and deserializers are shown in FIGS. 20 and 21.

Figure 9:
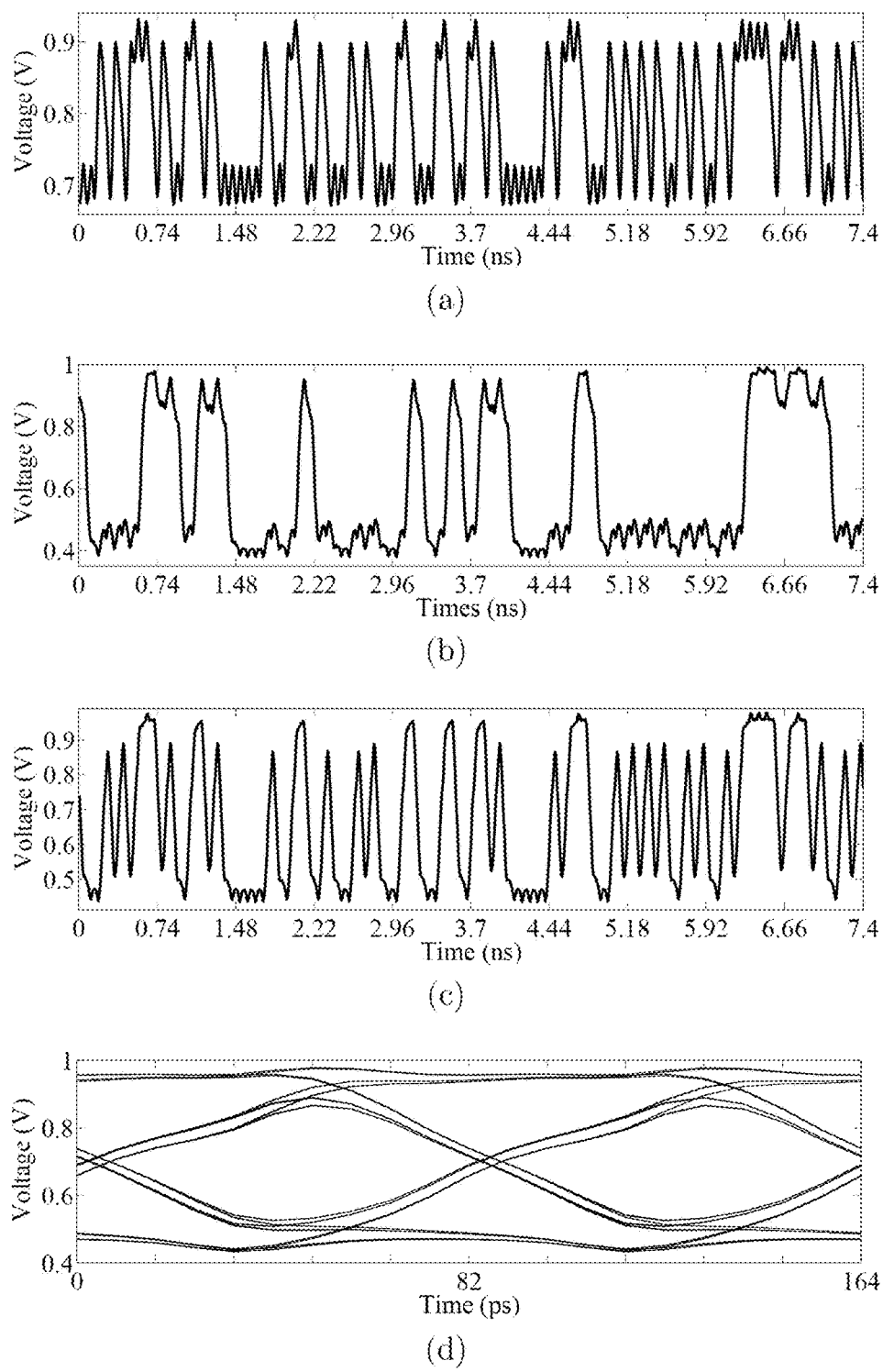
FIG. 9 is a simulation result with input data at 12.2 Gb/s data rate.

FIG. 9 is a simulation result with input data at 12.2 Gb/s data rate. Data rate of the D-Flip-Flop is enhanced by approximately 30% using local negative feedback in transparent phase of latch. This increases the data rate by 31% of the high speed D-Flip-Flop with 25% area and 12.5% power overhead. Simulation results in standard 90 nm CMOS technology of the high speed simulation confirmed the working of this technique with 12.2 Gb/s data rate, while consuming 18 mW off a 1V supply.

Figure 11:
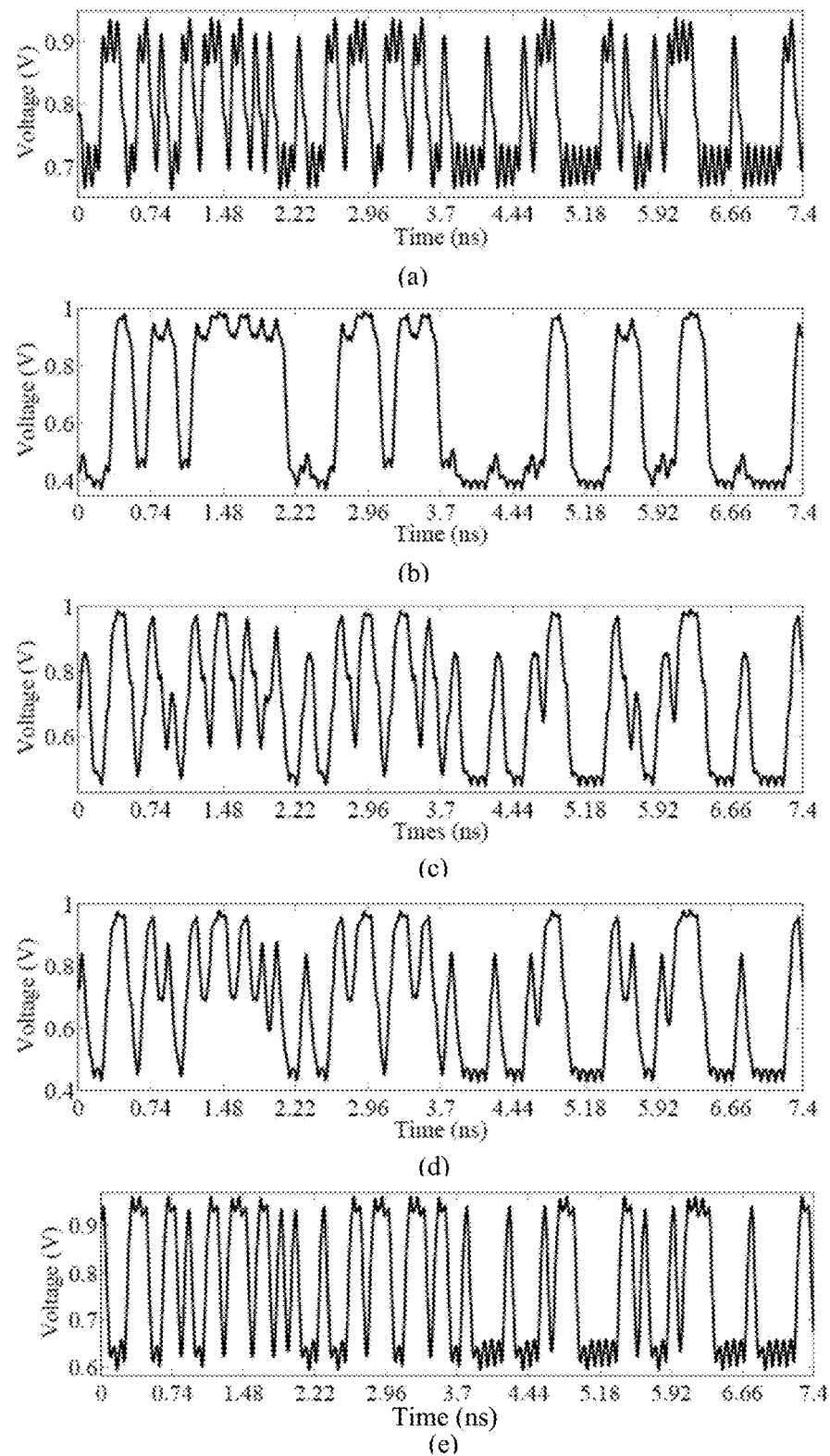
FIG. 11 is a simulation result with input data at 13.5 Gb/s data rate.
Figure 12:
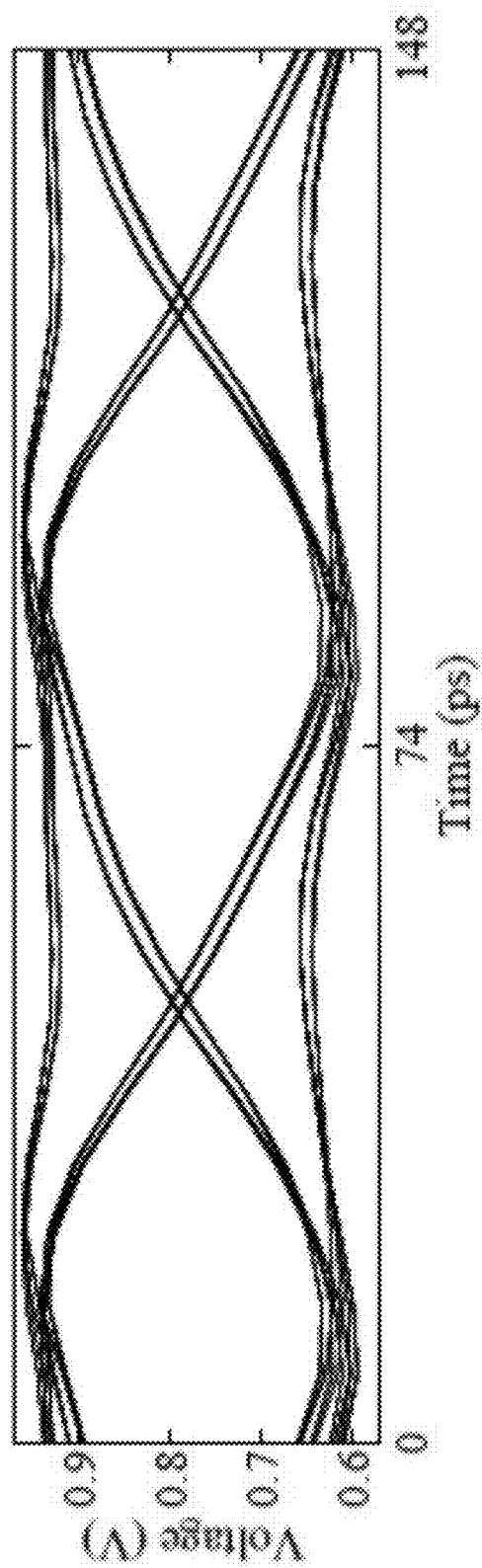
FIG. 12 is an eye diagram of feedback based D-Flip-Flop using feedback based latches output (13.5 Gb/s data rate, jitter$_{pp}$=3.6 ps and eye opening=300 mv)

FIG. 10 shows feedback based flip-flops using feedback based latches according to present invention. In this technique, advantage of feedback 1002; 1004 across latches 1008; 1010 based D-Flip-Flop and feedback based D-Flip-Flop are incorporated by adding same number of always active (ON) negative feedback loops across D-Flip-Flop, where no external control is required for enabling and disabling the feedbacks. This improves high speed D-Flip-Flop by 45%. This is applicable to all the applications mentioned hereinafter for feedback based flip-flops and negative feedback across latches based D-Flip-Flop. Feedback is provided by transconductance stage during implementation that can be made adaptive in nature based on process corner, temperature and decision of input. FIGS. 11 and 12 show simulation results of feedback based flip-flops with negative feedback across latches. This shows for 13.5 Gb/s input data-rate, only modified feedback based D-Flip-Flop with feedback across latches is working fine. A detailed comparison of D-Flip-Flops for same technology is shown in Table 1.

TABLE 1

| CML DFF based on | Conventional | Series Inductors | Feedback in DFFs | Feedback in latches | Feedback in DFF and Latches |
|---|---|---|---|---|---|
| Power (mW) | 16 | 16 | 17 | 18 | 19 |
| Speed (Gb/s) | 9.25 | 13 | 11.9 | 12.2 | 13.5 |
| Area (um²) | 30 × 40 | 200 × 220 | 30 × 44 | 30 × 50 | 30 × 54 |
| Eye Opening (mV) | 438 | 247 | 326 | 340 | 300 |
| $Q = \frac{\text{Eye-opening}}{\text{Max(eye-amp.)}}(\%)$ | 87 | 56 | 60 | 62 | 81.3 |

TABLE 1-continued

| CML DFF based on | Conventional | Series Inductors | Feedback in DFFs | Feedback in latches | Feedback in DFF and Latches |
|---|---|---|---|---|---|
| Jitter$_{pp}$ (ps) | 13 | 18 | 7 | 5.3 | 3.6 |
| FOM$\left(\frac{\text{Gbit}}{\text{J}\times\text{Hz}\times\text{m}^2}\right)$ | 4.01 | 0.15 | 4.41 | 3.76 | 3.65 |

$$FOM = \frac{DataRate}{f_T \times \text{Area} \times \text{Power}} \text{(The higher the better)}$$

Example 1

Pseudo Random Binary Sequence Generator (PRBSG)

Figure 13:
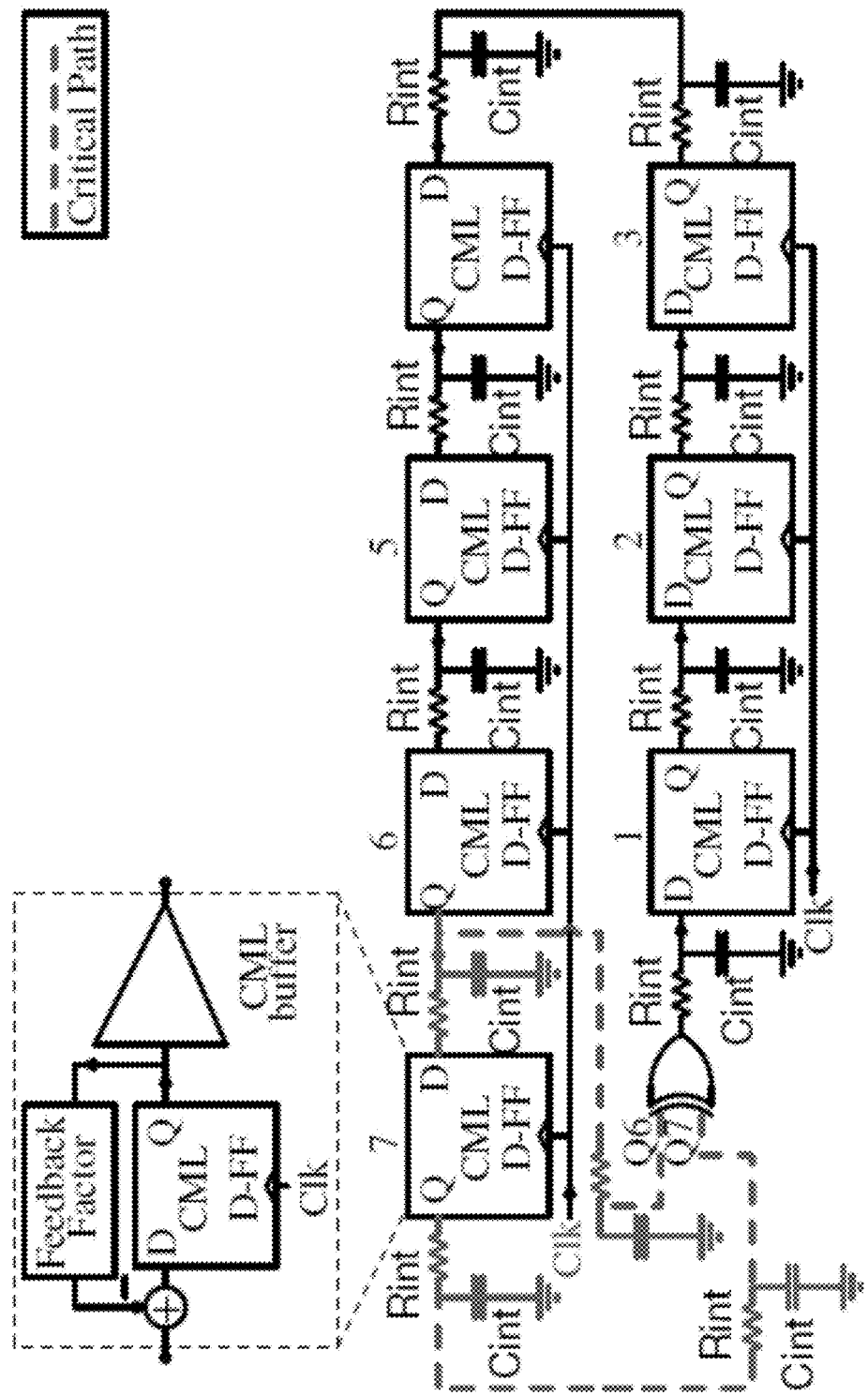
FIG. 13 is a block diagram of $2^7$–1 PRBS generator.

FIG. 13 is a block diagram of $2^7-1$ PRBS generator. A Pseudo Random Binary Sequence Generator (PRBSG) is based on linear feedback shift registers (LFSR). It contains minimum N flip-flops for $2^N-1$ PRBSG. Number of XORs and tapping of XORs ensure pseudo random sequence. $2^7-1$ PRBSG and its critical path are shown in FIG. 13. Maximum clock frequency is given by:

$$f_{Clk_{max}} = \frac{1}{T_{D67_{Clk-Q}} + T_{PXOR} + T_{D1_{set-up}}} \quad (10)$$

Where, $T_{D67_{Clk-Q}}$=Max($T_{D6_{Clk-Q}}$, $T_{D7_{Clk-Q}}$), $T_{D6_{Clk-Q}}$=Clock-to-Q delay of 6th D-Flip-Flop, $T_{D7_{Clk-Q}}$=Clock-to-Q delay of 7th D-Flip-Flop, $T_{PXOR}$=propagation delay of XOR and $T_{D1_{set-up}}$=Setup time of D-Flip-Flop.

In propagation delay of XOR, interconnect delay is major contributor because it contains longest path as shown in FIG. 13 thus making it the critical path. Each node of the PRBSG consist of parasitic resistance and capacitance which causes ISI. For example, parasitic resistance and capacitance at the XOR output node consist of $$R_{par} = R_{int} \quad (11)$$

$$C_{par} = C_{D_{XOR}} + C_{int} + C_{G_{DFF}} \quad (12)$$

Where, $R_{par}$=Parasitic resistance of XOR output,
$R_{int}$=Parasitic resistance of interconnect,
$C_{D_{XOR}}$=Parasitic capacitance at output XOR,
$C_{int}$=Parasitic capacitance of interconnect,
$C_{G_{DFF}}$=Parasitic capacitance of the input of the D-Flip-Flop.

Figure 14A:
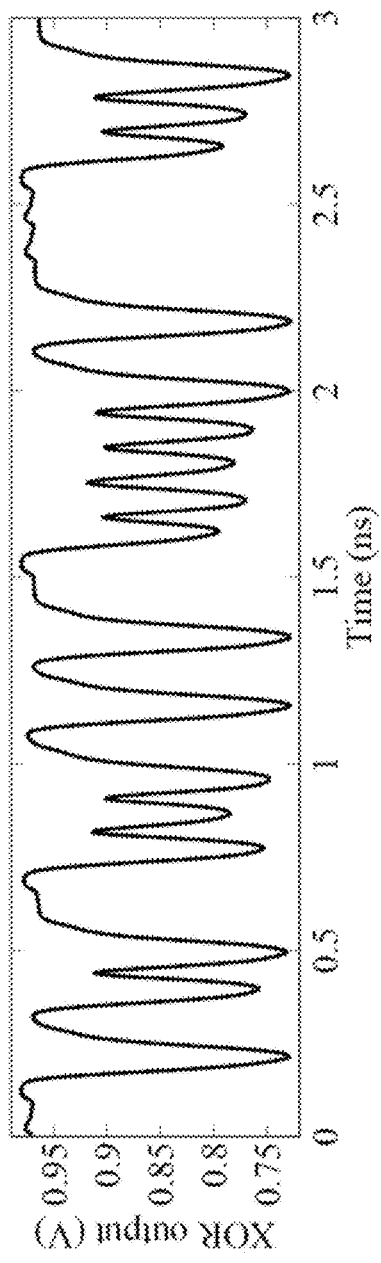
FIG. 14a is simulation result at 10.6 Gb/s data rate
Figure 14B:
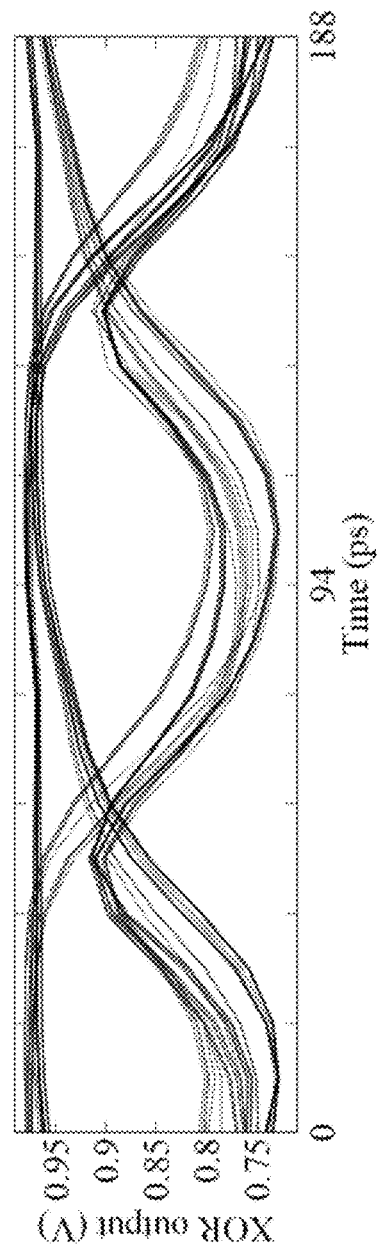
FIG. 14b is an eye diagram of XOR output at 10.6 Gb/s data rate (jitter$_{pp}$=4 ps in the conventional PRBS generator and eye opening=160 mv)

In the present invention work, interconnect is considered as an RC delay line as shown in FIG. 13 and an always active (ON) negative feedback across D-Flip-Flops are applied to enhance its bandwidth. Once the critical path is compensated as mentioned above, the signal path between 2 D-Flip-Flop's becomes the frequency limiting channel. This channel consists of 2 filters, 1) Interconnect between the latch output and CML buffer input of the D-Flip-Flop. 2) Between the CML buffer output and the input of subsequent D-Flip-Flop. These channels are also compensated by putting an always active (ON) feedback around a subsequent D-Flip-Flop's in the same manner. Multiple feedback coefficients can also be used with and without adaptation for improving the performance further. Any adaptation algorithm can be used to estimate feedback factors. FIG. 14a is simulation result at 10.6 Gb/s data rate and FIG. 14b is an eye diagram of XOR output at 10.6 Gb/s data rate (jitter$_{pp}$=24 ps in the conventional PRBS generator and eye opening=160 mv).

Figure 15:
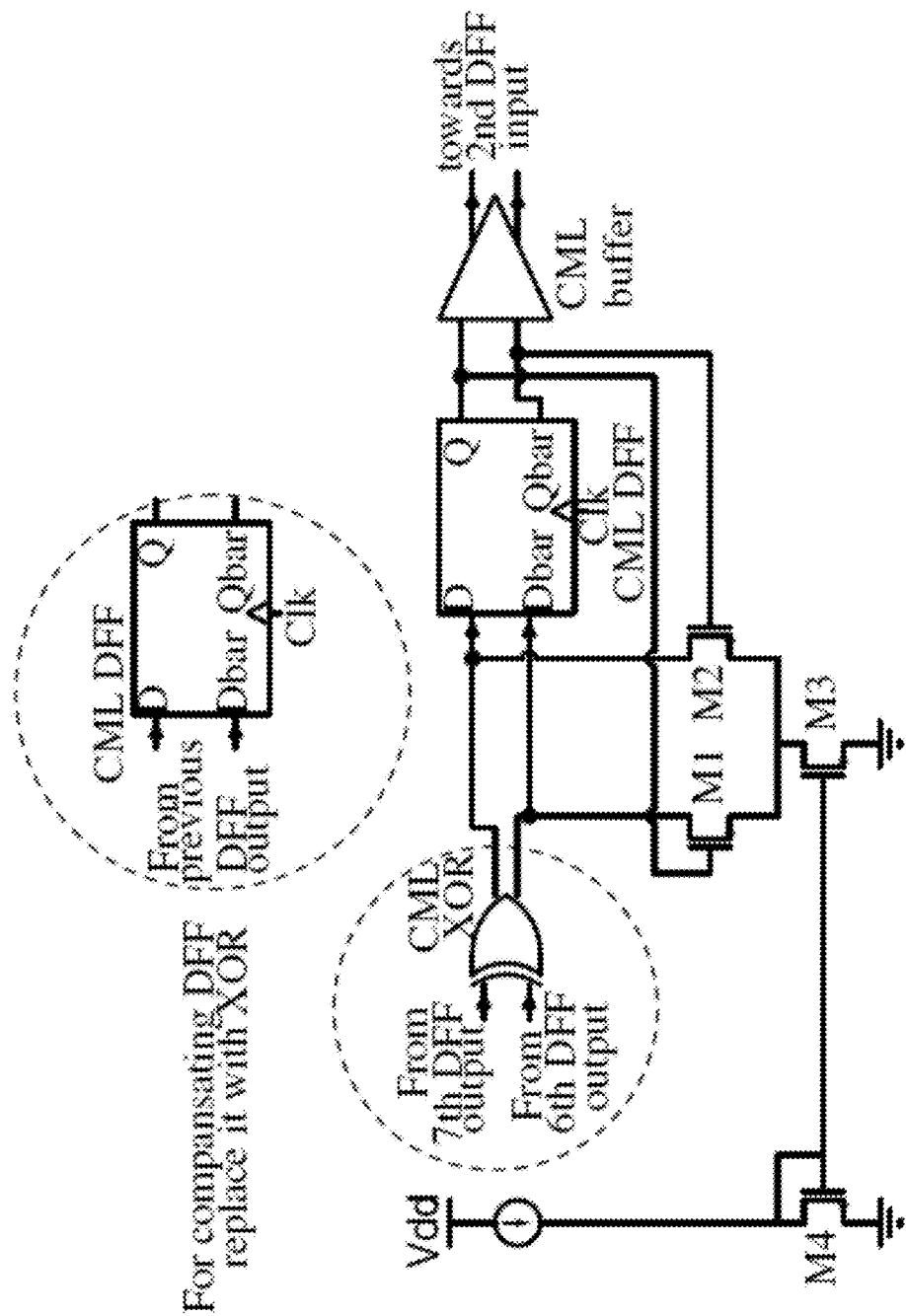
FIG. 15 is a block diagram of equalized XOR and D-Flip-Flop.
Figure 16A:
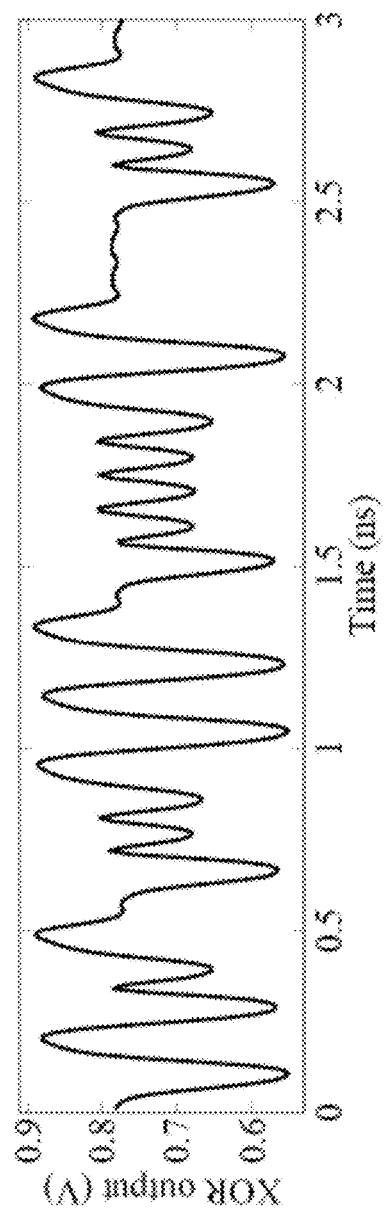
FIG. 16a is a simulation result at XOR output node.
Figure 16B:
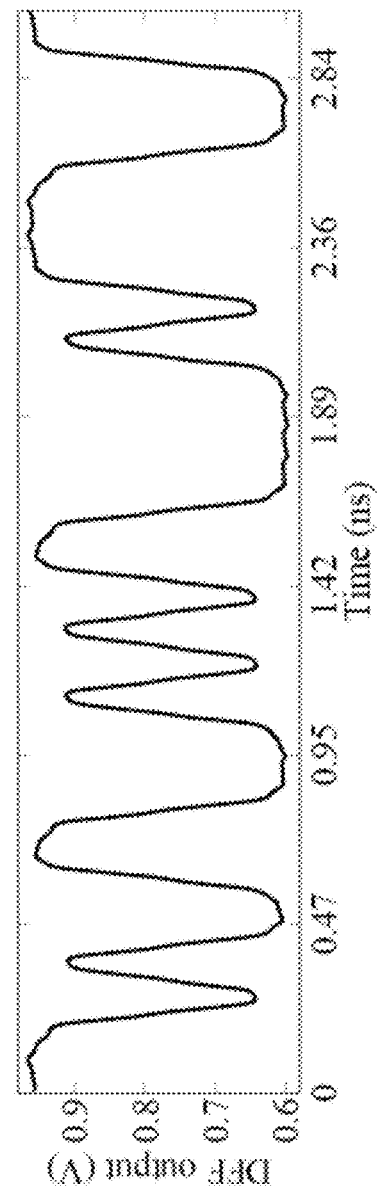
FIG. 16b is a simulation results after D-Flip-Flop output node
Figure 16C:
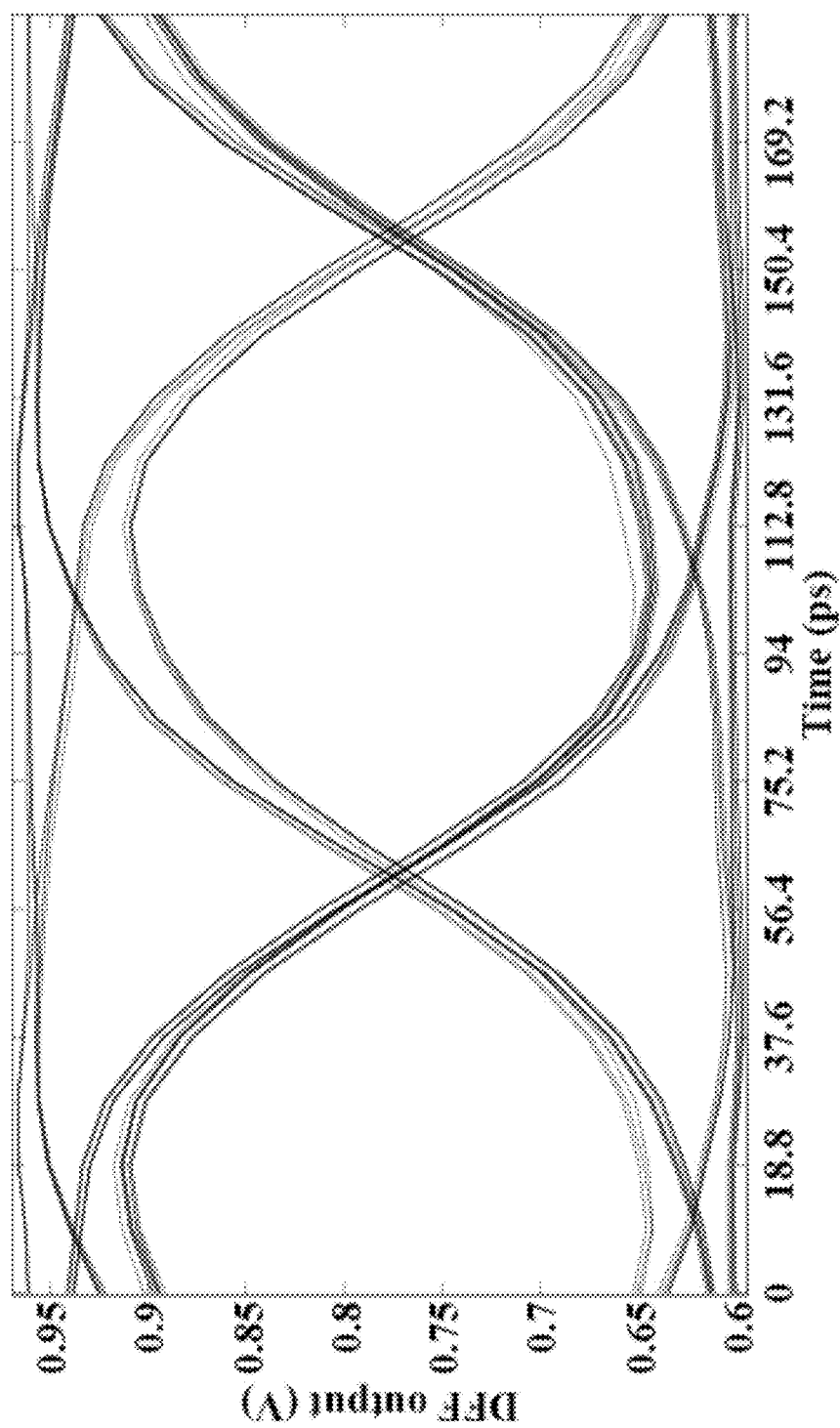
FIG. 16c is an eye diagram of compensated XOR, D-Flip-Flop at 10.6 Gb/s data rate (jitter$_{pp}$=3.5 ps and eye opening=240 my in the proposed PRBS generator)

CML D-Flip-Flop is used to provide delay and output of D-Flip-Flop is fed back to Y through one trans-conductance stage as shown in FIG. 15. The incorporation of the feedback stages changes the parasitic loading. Hence some empirical optimization of the feedback factor at the circuit level needs to be done, which leads to a feedback factor of 0.3. Output of equalized PRBSG is shown in FIG. 16b. FIG. 16c shows the eye diagram which has vertical eye opening of 250 mV and jitter$_{pp}$ of 3.5 ps. Same technique is employed on other nodes of PRBSG for enhancing data-rate. Only inspection of the eye diagram may not be sufficient, as even a single misinterpreted bit by XOR can reduce the run length of the PRBS drastically. Hence one should verify the PRBS by examining the total generated sequence. Comparison between conventional, inductive peaking based and modified PRBS generator is shown in Table 2.

TABLE 2

| PRBS Gen. | Conventional | Inductor based | Proposed |
|---|---|---|---|
| Power (mW) | 190 | 190 | 222 |
| Maximum Speed (Gb/s)) | 10.6 | 13 | 13 |
| Area (PRBS core) (um$^2$) | 64 × 187 | 800 × 400 | 64 × 220 |
| Eye Opening (mV) | 263 | 247 | 200 |
| Jitter$_{pp}$ (ps) | 9 | 15 | 8 |
| FOM$\left(\frac{\text{Gbit}}{\text{J}\times\text{Hz}\times\text{m}^2}\right)$ | 93.1 | 3.48 | 90.84 |

$$FOM = \frac{\log_2(MLS) \times DataRate}{f_T \times \text{Area} \times \text{Power}} \text{(The higher the better)}$$

Figure 17A:
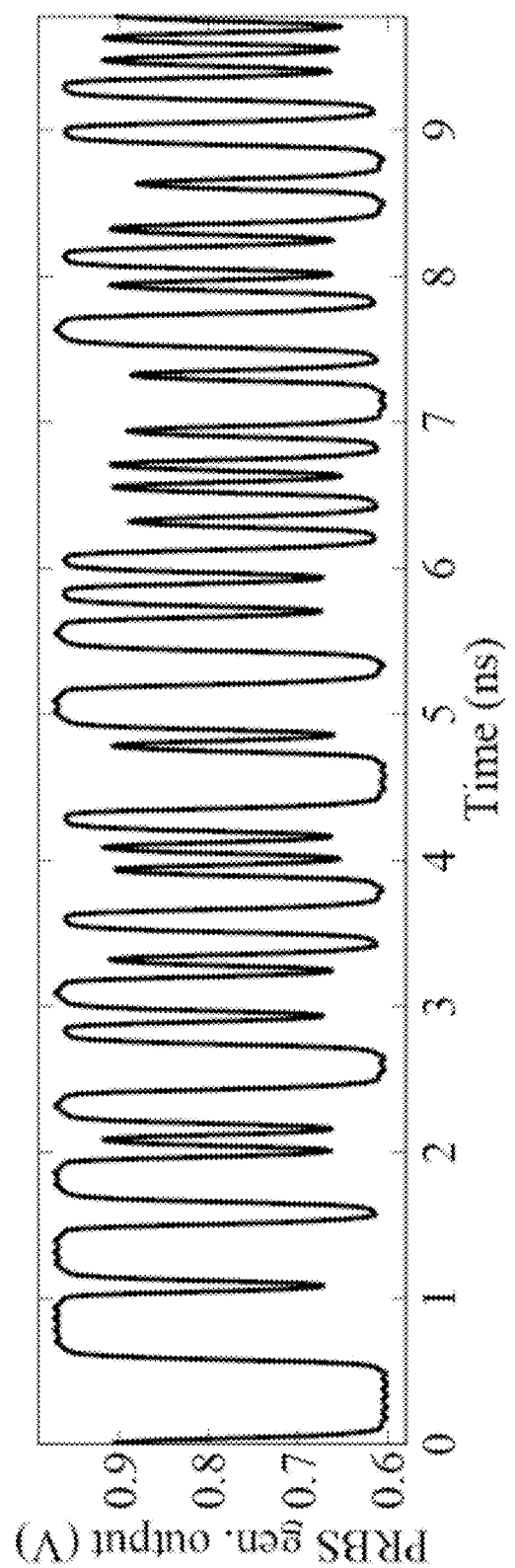
FIG. 17a is a simulation result of $2^7$–1 PRBS generator (complete 127 cycles)
Figure 17B:
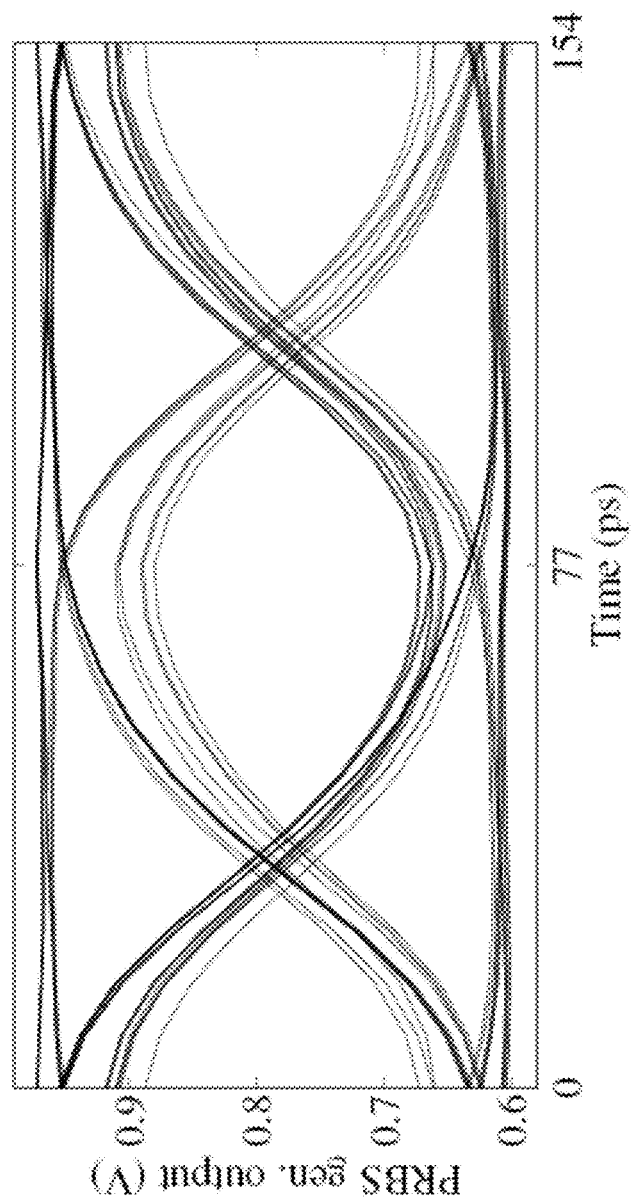
FIG. 17b is eye diagram for $2^7$–1 PRBS generator at 13 Gb/s data rate (jitter$_{pp}$=8 ps and eye opening=200 mv)

In modified PRBSG, speed is increased with approximately same FOM. Simulation results at 13-Gb/s confirm correct functional operation of the PRBS as shown in FIG. 17a and FIG. 17b. As a worst case a triangular waveform is used as the clock. Simulation are performed in typical-typical corner with temperature of 100 C. For optimized performance across temperature and process variations, the feedback factor can be adjusted by adjusting current in the feedback amplifier.

Example 2

Clock and Data Recovery (CDR) Circuit

Figure 18:
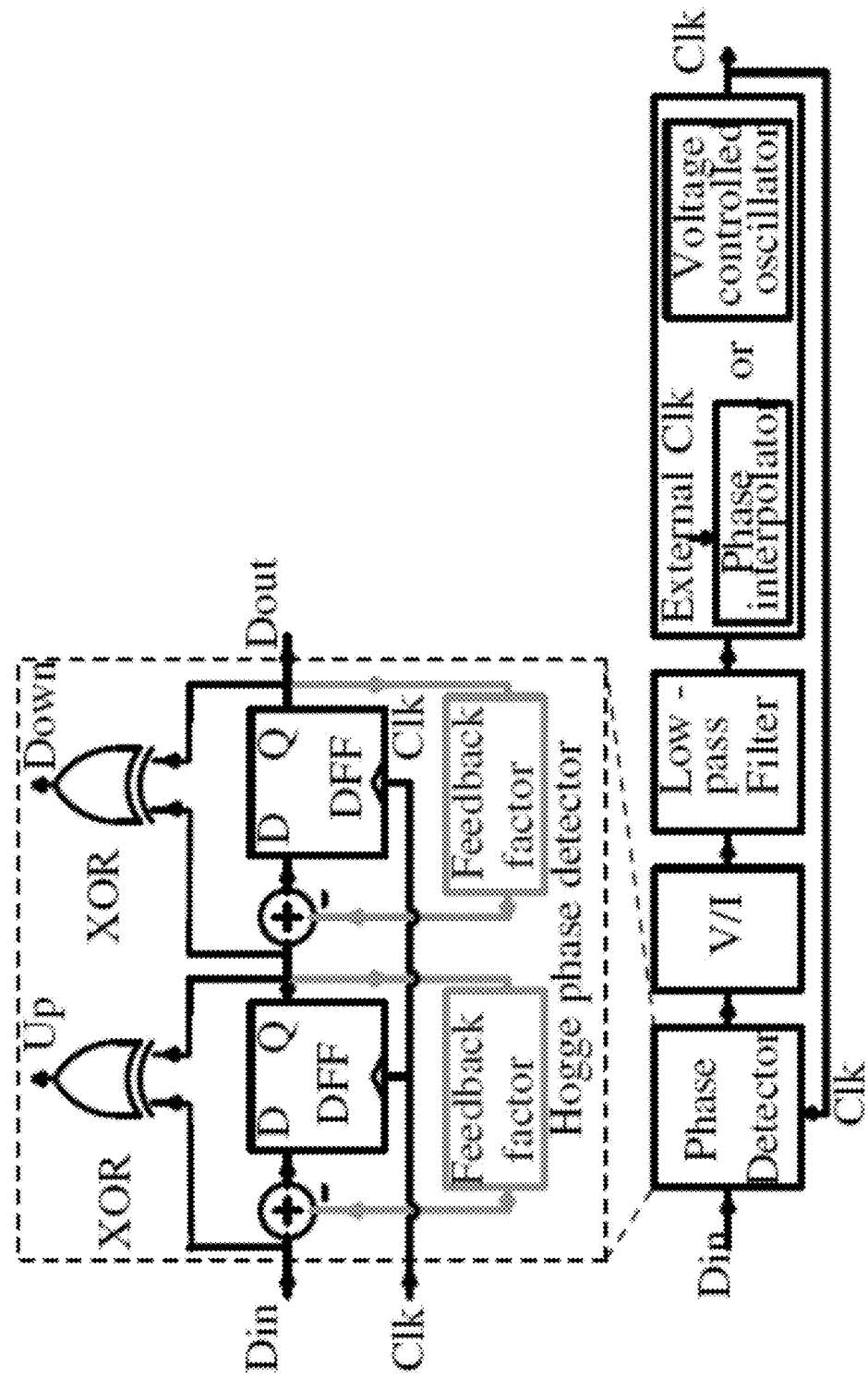
FIG. 18 is a block diagram of clock and data recovery circuits with feedback based flip-flops.
Figure 19:
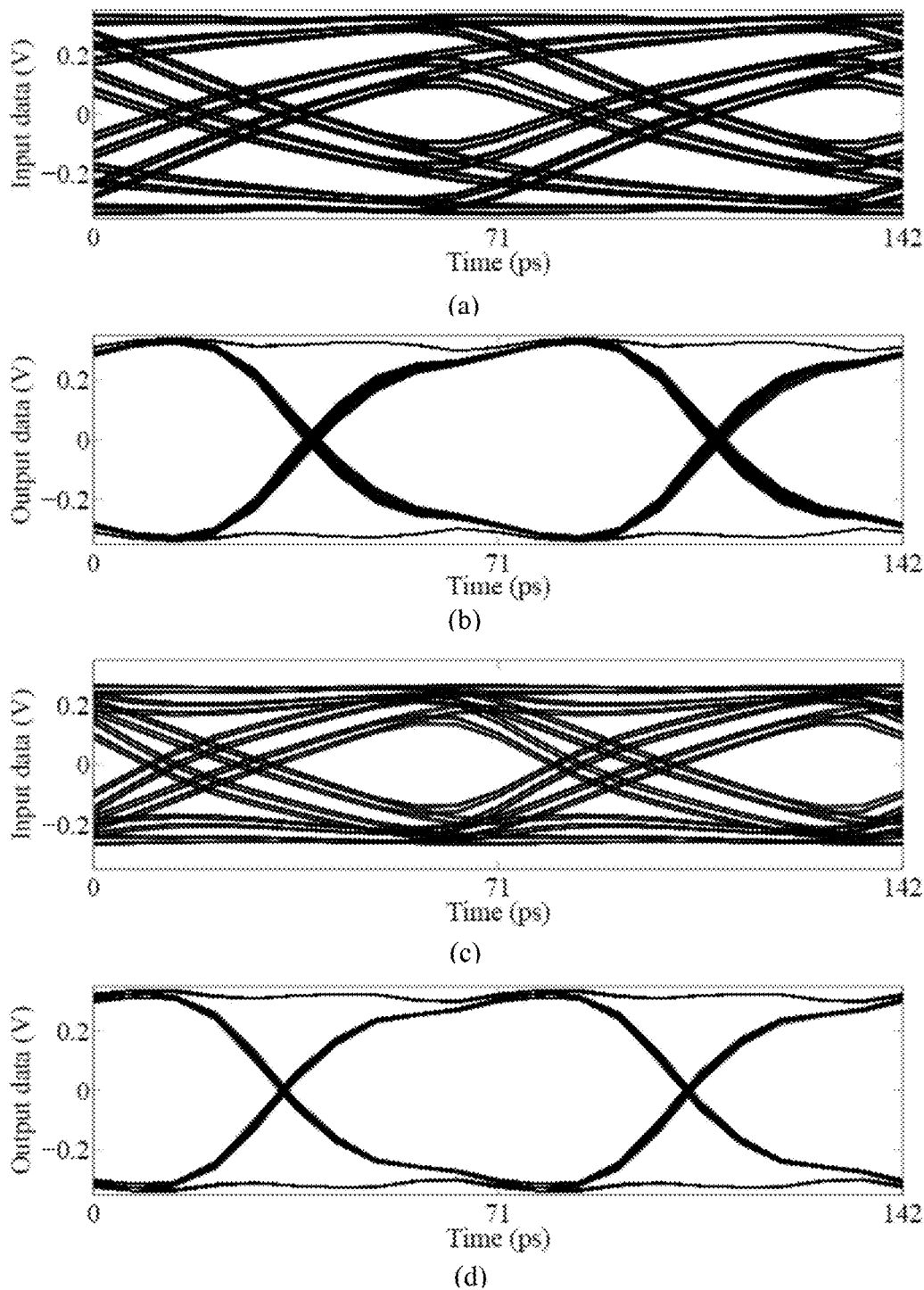
FIG. 19 is a simulation result of Hogge phase detector based CDR circuit.

Clock and data recovery (CDR) circuits are used for clock extraction and re-timing of data at receiver side. In this demonstration of feedback across latches based D-Flip-Flop, phase detector of CDR circuit is modified. Hogge phase detector is shown in FIG. 18. Simulation results shown in FIG. 19 reflects proposed D-Flip-Flop based CDR has good eye opening with less jitter as compare to conventional D-Flip-Flop based CDR which helps it in settle quickly. Similarly, any type of phase detector can be used in same fashion with proposed negative feedback based D-Flip-Flop. This technique can also be employed on serialization of data before the multiplexer and also in de-multiplexing of data.

Example 3

Serializers and Deserializers

Implementation of negative feedback across latches based D-Flip-Flop, as described in FIG. 3, in serializers and deserializers are shown in FIGS. 20 and 21. This technique improves performance of D-Flip-Flop by improving each latch performance using feedback based latches. Feedback factor of local loop of latches can be made adaptive based on process corner and temperature i.e. the feedback coefficient is adjusted automatically based on a process and temperature detection circuitry.

As described hereinbefore, performance of D-Flip-Flop is improved by an always active (ON) negative feedback and individual latches are also improved by always active (ON) negative feedbacks. Negative feedback across D-Flip-Flop mitigates timing errors which is caused by RC delay at the input of D-Flip-Flop. Similarly, latches are also improved. The difference between these two feedbacks are, feedback based flip-flops is discrete time in nature and negative feedback based latches are continuous time in nature. Individually, these improve speed by 35% and 25% respectively and combination of these two types of feedback provides 45% improvement in speed while consuming 18.75% power and 35% area with respect to conventional D-Flip-Flop. Timing errors are also corrected so efficiently that it creates distributed equalization in communication links and helps to relax requirement of equalizers using negative feedbacks.

While the present invention has been described with respect to certain embodiments, it will be apparent to those skilled in the art that various changes and modification may be made without departing from the scope of the invention as defined in the following claims.

What is claimed is:

1. A flip-flop having an input terminal and an output terminal, comprising:
    a first latch having an input terminal and an output terminal;
    a second latch having an input terminal and an output terminal, wherein the first latch and the second latch are arranged in a master-slave configuration such that the input terminal of the first latch is also the input terminal of the flip-flop and the output terminal of the second latch is also the output terminal of the flip-flop, and wherein the output terminal of the first latch is directly connected to the input terminal of the second latch; and
    at least one feedback path for adding signal from the output terminal of the second latch to the input terminal of the first latch wherein both the output terminal of the second latch and the input terminal of the first latch are directly connected to a first feedback circuit of the at least one feedback path, or from the output terminal of the first latch to the input terminal of the first latch wherein both the output terminal of the first latch and the input terminal of the first latch are directly connected to a second feedback circuit of the at least one feedback path;
    wherein the at least one feedback path comprises at least one of an always active (ON) transconductance stage and an always active (ON) inverter stage.

2. The flip-flop as claimed in claim 1, wherein the at least one feedback path comprises:
    a first feedback path from the output terminal of the first latch to the input terminal of the first latch;
    a second feedback path from the output terminal of the second latch to the input terminal of the second latch; and
    a third feedback path from the output terminal of the second latch to the input terminal of the first latch.

3. The flip-flop as claimed in claim 1, wherein the at least one feedback path comprises:
    a first feedback path from the output terminal of the first latch to the input terminal of the first latch; and
    a third feedback path from the output terminal of the second latch to the input terminal of the first latch.

4. The flip-flop as claimed in claim 1, wherein the at least one feedback path comprises:
    a second feedback path from the output terminal of the second latch to the input terminal of the second latch;
    a third feedback path from the output terminal of the second latch to the input terminal of the first latch.

5. The flip-flop as claimed in claim 1, wherein the at least one feedback path is a negative feedback path.

6. The flip-flop as claimed in claim 1, wherein a strength of a feedback of the at least one feedback path is adapted using a control mechanism.

7. The flip-flop as claimed in claim 1, wherein the at least one feedback path comprises:
    a first feedback path from the output terminal of the first latch to the input terminal of the first latch; and
    a second feedback path from the output terminal of the second latch to the input terminal of the second latch.

* * * * *